United States Patent
Bäurle et al.

(10) Patent No.: US 10,181,813 B2
(45) Date of Patent: Jan. 15, 2019

(54) HALF-BRIDGE INVERTER MODULES WITH ADVANCED PROTECTION THROUGH HIGH-SIDE TO LOW-SIDE CONTROL BLOCK COMMUNICATION

(71) Applicant: Power Integrations, Inc., San Jose, CA (US)

(72) Inventors: Stefan Bäurle, San Jose, CA (US); Michael Yue Zhang, Mountain View, CA (US); Yury Gaknoki, San Jose, CA (US)

(73) Assignee: Power Integrations, Inc., San Jose, CA (US)

( * ) Notice: Subject to any disclaimer, the term of this patent is extended or adjusted under 35 U.S.C. 154(b) by 10 days.

(21) Appl. No.: 15/336,658

(22) Filed: Oct. 27, 2016

(65) Prior Publication Data
US 2018/0123495 A1 May 3, 2018

(51) Int. Cl.
| | |
|---|---|
| H02H 1/00 | (2006.01) |
| H02P 27/06 | (2006.01) |
| H02H 7/08 | (2006.01) |
| H02P 6/14 | (2016.01) |
| H02M 1/08 | (2006.01) |
| H02M 1/32 | (2007.01) |

(Continued)

(52) U.S. Cl.
CPC ........... *H02P 27/06* (2013.01); *H02H 7/0805* (2013.01); *H02H 7/0811* (2013.01); *H02H 7/122* (2013.01); *H02H 7/1222* (2013.01); *H02H 7/1225* (2013.01); *H02H 7/1227* (2013.01); *H02M 1/08* (2013.01); *H02M 1/32* (2013.01); *H02P 6/14* (2013.01); *H03K 17/08* (2013.01)

(58) Field of Classification Search
CPC ........ H02H 1/0046; H02H 3/042; H02H 3/32; H02H 7/0838; H02H 7/00; H02H 7/0856; H02H 9/043; H02H 7/122; H02H 9/004; H02P 8/36
See application file for complete search history.

(56) References Cited

U.S. PATENT DOCUMENTS

| | | | |
|---|---|---|---|
| 2006/0129889 A1 | 6/2006 | Arndt et al. | |
| 2007/0040520 A1* | 2/2007 | De Filippis | ............. H02P 6/182 318/400.04 |

(Continued)

OTHER PUBLICATIONS

European Patent Application No. 17198541.9—Extended European Search Report dated Mar. 19, 2018, 11 pages.

*Primary Examiner* — Bickey Dhakal
(74) *Attorney, Agent, or Firm* — Christensen O'Connor; Johnson Kindness PLLC

(57) ABSTRACT

A communication system for use in a switching module includes a low-side control block coupled to control switching of a low-side switch of the switching module. The low-side control block is further coupled to be referenced with a low-side reference system ground. A high-side control block is coupled to control switching of a high-side switch of the switching module. The high-side control block is further coupled to be referenced with a floating node of the switching module. During steady state operation, the low-side control block is coupled to send signals during each switching cycle to the high-side control block to turn the high-side switch on and off. A status update is communicated from the high-side control block to the low-side control block through a first single-wire communication link.

25 Claims, 5 Drawing Sheets

(51) Int. Cl.
*H02H 7/122* (2006.01)
*H03K 17/08* (2006.01)

(56) References Cited

U.S. PATENT DOCUMENTS

| | | |
|---|---|---|
| 2007/0279106 A1 | 12/2007 | Bennett et al. |
| 2011/0031978 A1 | 2/2011 | Garneyer et al. |
| 2012/0038391 A1* | 2/2012 | Lee ........................ H02H 7/122 |
| | | 327/109 |
| 2014/0133186 A1 | 5/2014 | Balakrishnan et al. |
| 2014/0347103 A1 | 11/2014 | Snook et al. |
| 2015/0303797 A1 | 10/2015 | Akahane |
| 2016/0111961 A1 | 4/2016 | Balakrishnan et al. |
| 2017/0019093 A1* | 1/2017 | Kanda ...................... H03K 5/04 |

* cited by examiner

HALF-BRIDGE INVERTER MODULES WITH ADVANCED PROTECTION THROUGH HIGH-SIDE TO LOW-SIDE CONTROL BLOCK COMMUNICATION

BACKGROUND INFORMATION

Field of the Disclosure

The present invention generally relates to fault and status communication between a low-side control block and a high-side control block of a half bridge inverter. More specifically the present invention relates to communication between high-side and low-side control blocks in half-bridge inverter modules that may be utilized in 2-phase or 3-phase brushless dc (BLDC) or synchronous motor drives.

Background

Household and industrial appliances such as ventilation fans, cooling systems, refrigerators, dishwasher, washer/dryer machines, and many other white products/goods typically utilize electric motors that transfer energy from an electrical source to a mechanical load. Electrical energy for driving the electric motors is provided through a drive system, which draws electrical energy from an electrical source (e.g., from an ac low frequency source). The electrical energy received from the electrical source is processed through a power converter, and converted to a desired form of electrical energy that is supplied to the motor to achieve the desired mechanical output. The desired mechanical output of the motor may be for example the speed of the motor, the torque, or the position of a motor shaft.

Motors and their related circuitries such as motor drives represent a large portion of network loads. The functionality, efficiency, size, and price of motor drives are challenging and competitive factors that suppliers of these products consider. The functions of a power converter in a motor drive include providing the input electrical signals to the motor such as voltage, current, frequency, and phase for a desired mechanical output load motion (e.g., spin/force) on the motor shaft. The power converter in one example may be an inverter transferring a dc input to an ac output of desired voltage, current, frequency, and phase. Controller of the power converter regulates the energy flow in response to signals that are received from a sensor block. The low power sensed signals from the motor or power converter are sent to the controller in a closed loop system by comparing the actual values to the desired values. The controller adjusts the output in comparison of the actual values to the desired values to maintain the target output.

Brushless dc (BLDC) motors, which are known for their higher reliability and efficiency, are becoming a popular choice in the market replacing brushed dc and ac motors. They are widely used in household appliances, such as refrigerators, air conditioners, vacuum cleaners, washers/driers, and other white goods, and power tools such as electric drills, or other electric tools.

A BLDC motor requires a power converter, which typically includes an inverter stage of a three-phase or three single-phase modules of half-bridge switchers. A half-bridge switcher module may include power switches and a controller inside of an integrated circuit, which provides a compact structure having a smaller size and higher efficiency. The reliability of half-bridge switcher function and operation depends on the processing of feedback and error signals received from the sensors, and the response of the controller to regulate the desired outputs and provide an efficient protection against possible faults.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1A:
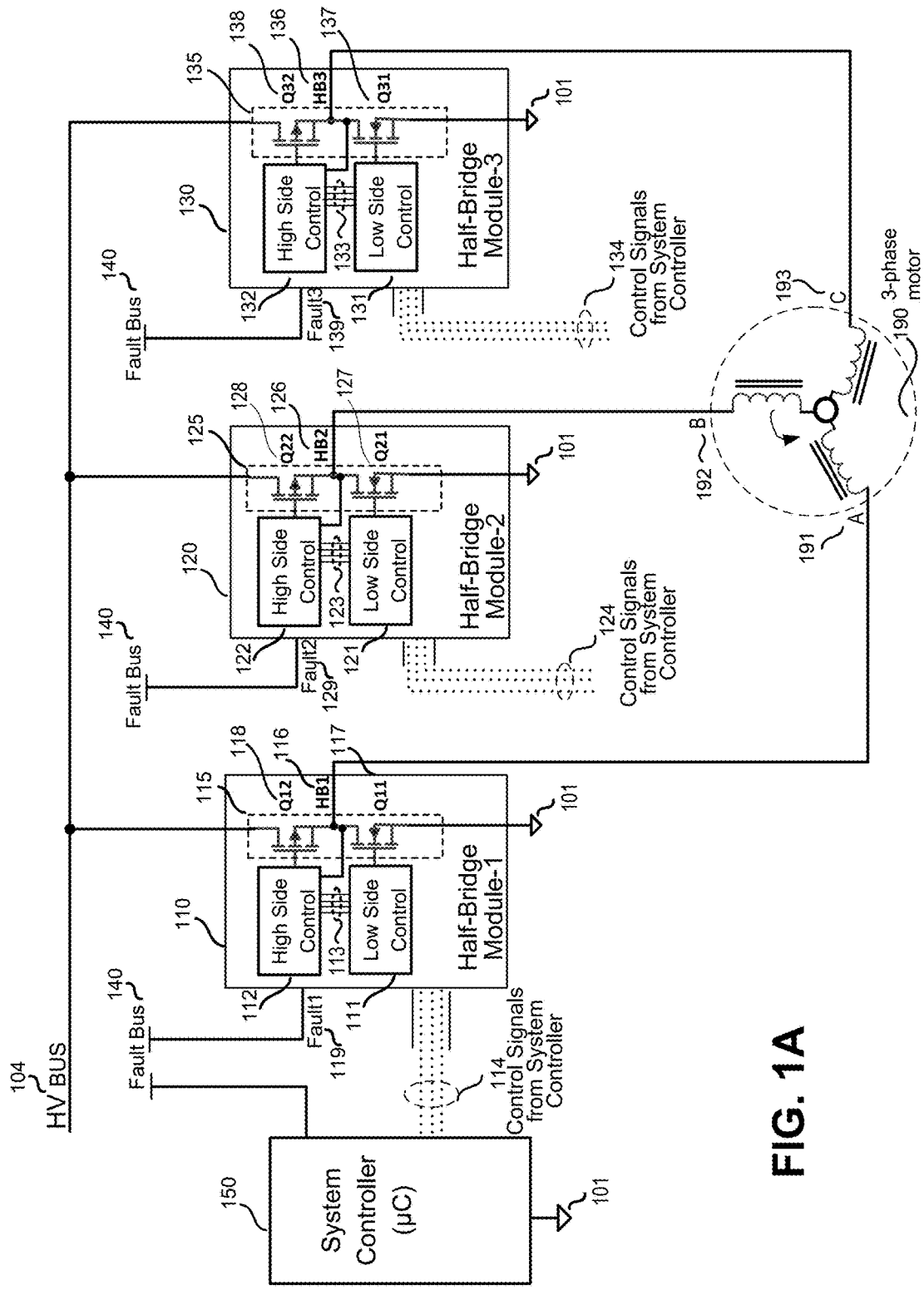
FIG. 1A shows a general view of example system level blocks of three half-bridge inverter modules coupled individually to a high voltage bus and controlled by a single controller in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description specific details are set forth, such as device types, voltages, component values, circuit configurations, etc., in order to provide a thorough understanding of the embodiments described. However, persons having ordinary skill in the relevant art will appreciate that these specific details may not be needed to practice the embodiments described. It is further appreciated that well known circuit structures and elements have not been described in detail, or have been shown in block diagram form, in order to avoid obscuring the embodiments described.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or sub-combinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art.

In the context of the present application, when a transistor is in an "off state", or "off", the transistor does not substantially conduct current. Conversely, when a transistor is in an "on state", or "on", the transistor is able to substantially conduct current. By way of example, in one embodiment, a high-voltage transistor comprises an N-channel metal-oxide-semiconductor field-effect transistor (NMOS) with the high-voltage being supported between the first terminal, a drain, and the second terminal, a source. The high voltage MOSFET comprises a power switch that is driven by an integrated controller circuit to regulate energy provided to a load. For purposes of this disclosure, "ground" or "ground potential" refers to a reference voltage or potential against which all other voltages or potentials of an electronic circuit or integrated circuit (IC) are defined or measured.

Half-bridge inverter modules are coupled to drive a multiphase motor in response to a system controller. The switching block of each half-bridge inverter module includes a high side switch coupled to a low side switch, with a mid-point terminal between the high side switch and the low side switch coupled to a respective phase terminal of the multiphase motor. As will be shown, examples in accordance with the teachings of the present invention provide a compact inclusive structure of the half-bridge inverter module in an interface with the system controller (e.g., microcontroller μC). Thus, in one example, the controlled half-bridge inverter (e.g., switcher) will require less external components and reduced pin count usage in accordance with the teachings of the present invention.

It will be appreciated that even though example figures and descriptions of the present disclosure is focus on the application of status and fault communications between high-side and low-side control blocks or drivers in a half-bridge inverter module for use in a multi-phase motor drive (e.g., BLDC motor), it should not be considered as a limitation. As would be understood by someone skilled in art, examples in accordance with the teachings of the present invention may be utilized in any switching device/module that includes a low-side switch and control block or driver referenced to ground (e.g., the source of a low-side switch) and a high-side control block or driver that is referenced to a floating node (e.g., the source of a high-side switch). In various examples, examples of the disclosed communication of fault and status update between the high-side and low-side control blocks or drivers provide a fast and reliable protection for a variety of applications. It is also understood that the example load illustrated in the present disclosure could be a variety of single or multi-phase loads such as ac or dc motor drives or other suitable types of loads in accordance with the teachings of the present invention.

As mentioned, BLDC motors are becoming increasingly popular in household appliances and power tools. Some of the main reasons why BLDC motors are becoming increasingly popular are due to their higher efficiency and reliability, and less audible noise compared to brushed or universal motors. BLDC motors are typically driven with 2-phase or 3-phase inverters through half-bridge switcher configurations. High voltage (HV) BLDC motors offer better efficiency and lower cost compared to their low voltage (LV) counterparts. The off-line motor drives typically run off of a rectified ac mains (e.g., 325 Vdc bus), or from a power factor correction (PFC) stage output (e.g., a 395 Vdc bus).

Inverters with half-bridge switching configurations are commonly used with motor drives. Instead of implementing a full bridge switching configuration, utilizing a half-bridge switching circuit with low-side and high-side control blocks inside one single package (e.g., a module) allows support for multiphase inverters, such 2-phase and 3-phase inverters, that provide increased layout flexibility as well as simplified thermal management for each module. Utilization of a modular half-bridge circuit structure for a motor drive inverter may reduce overall system cost because of a variety of reasons.

For instance, with an HV buffer (e.g., a tap terminal) on a switching device (e.g., MOSFET), a half-bridge module may fully operate self-powered without requiring an additional auxiliary supply. In addition, a half-bridge module coupled as a multiphase inverter, such as a 2-phase or 3-phase inverter configuration, may operate with a single system controller (μC) to integrate protection features such as HV bus sensing and remote thermal sensing. Moreover, current sensing for controlling the motor and for overcurrent fault protection may also be integrated in a half-bridge switching circuit structure (e.g., through a sense FET), which removes the need for costly external shunt resistors and associated circuitry.

As will be discussed, an efficient method and implementation for communication of control and protection signals from a high-side control block, which is referenced to a floating point, to a low-side control block, which is referenced to system ground. Examples in accordance with the teachings of the present invention offer an efficient process of encoding the detected faults, transferring the encoded communication from the high-side control block to the low-side control block, and decoding the communication in a system controller that is referenced to system ground. This integrated solution in accordance with the teachings of the present invention may be utilized for any application with control blocks that are not referenced to the same reference node (e.g., system ground). The example circuitry and description in this disclosure should not be considered as a limitation for the wide applications of this invention. The specific example described for implementation in a half-bridge inverter module may reduce pin count and external circuit components compared to known solutions that have increased size and cost.

It is also appreciated that even though in the example figures of the present disclosure the system controller is depicted as a microcontroller μC, other options such as a digital signal processor (DSP) controller, or microprocessor may be applicable in different applications in accordance with the teachings of the present invention.

An efficient communication from a high-side control block or driver to a low-side control block or drive allows for information to be gathered by and transmitted from the floating referenced high-side driver to the ground potential referenced low-side control block or driver. With this interface in place, additional integrated system level protection features are possible which in turn reduces overall cost in an inverter based motor drive in accordance with the teachings of the present invention.

For instance, device level and system level protection features may be monitored by the floating high-side driver by monitoring the instantaneous drain current of the high-side MOSFET for protection against motor short circuit.

Monitoring the junction temperature of the low-side MOSFET through high-side float driver is possible because both the high-side and the low-side devices share the same die attach paddle. The high-side to low-side communication may additionally be used to send an acknowledge signal when the high-side driver is fully operational and no fault is detected. In steady state operation, communication from the low-side (LS) to the high-side (HS) control is regularly required for turning the HS MOSFET on and off. The LS driver sends one pulse each switching cycle to the HS driver for turning the HS MOSFET on or off. In case the high-side control detects a fault, it communicates the type of fault to the low-side control. This allows the low-side control to flag the fault to the system controller (e.g., microcontroller μC) through a fault terminal output of the half-bridge inverter module.

To illustrate, FIG. 1A shows an example implementation of system level blocks of a multiphase motor drive system including three half-bridge inverter modules coupled individually to an HV bus and controlled with a single system controller to drive a multiphase motor, such as for example a 2-phase or 3-phase motor, in accordance with the teachings of the present invention. As shown in FIG. 1A, each switching block of each half-bridge inverter module includes a high side switch in series to a low side switch, which are coupled between HV bus 104 and ground 101. The midpoint terminals HB1 116 in half-bridge inverter module 110, HB2 126 in half-bridge inverter module 120, and HB3 136 in half-bridge inverter module 130, are coupled between the respective high side switch and low side switch of each half-bridge inverter module 110, 120, and 130, and are coupled to generate controlled ac voltages that are coupled to the respective phase terminals A 191, B 192 and C 193 of the multiphase motor 190.

An efficient communication from the high-side control block or driver to the low-side control block or driver allows for information gathered by the floating high-side control block or driver to be transmitted to the ground potential referenced low-side control block or driver. As shown, the high-side and low-side control blocks in each half-bridge inverter module 110, 120, and 130 have communication links 113, 123 and 133 with each other. With this interface in place, additional integrated system level protection features are possible, which in turn reduces overall cost in an inverter based motor drive in accordance with the teachings of the present invention.

The device level and system level protection features that are monitored by the floating high-side driver and communicated through the link between high-side and low-side control blocks or drivers may include: (1) monitoring the instantaneous drain current of the high-side MOSFET for protection against motor short circuit; (2) monitoring the junction temperature of the low-side LS MOSFET through high-side float driver which is possible because both the HS and the LS devices share the same heatsink pad (die attach paddle); and (3) sending an acknowledge signal when the HS driver is fully operational and no fault is detected.

In one example, the fault and status information either monitored or detected in the floating high-side control block or driver and communicated to low-side ground referenced control block or driver may be directly monitored or detected by low-side control block, and are then communicated through a single-wire fault communication bus between devices and/or the system controller in multi-fault groups.

As shown in FIG. 1A, the half-bridge inverter module 110 includes switching configuration 115, which includes LS switch Q11 117 and HS switch Q12 118). The half-bridge inverter module 120 includes switching configuration 125, which includes LS switch Q21 127 and HS switch Q22 128. The half-bridge inverter module 130 includes switching configuration 135, which includes LS switch Q31 137 and HS switch Q32 138). LS and HS control blocks 111 and 112 in half-bridge inverter module 110, LS and HS control blocks 121 and 122 in half-bridge inverter module 120, and LS and HS control blocks 131 and 132 in half-bridge inverter module 130, run the corresponding LS/HS switches. Control signals 114, 124, and 134, which are coupled to modules 110,120 and 130, communicate the feedback and function information with controller, μC 150. Fault terminals 119, 129 and 139 on half-bridge inverter modules 110, 120 and 130, respectively, communicate fault and status report information through a single-wire fault bus 140 to the system controller, μC 150. It is appreciated that there may be additional terminals on each half-bridge inverter module, some of which are illustrated and described in more detail in FIG. 2.

Figure 1B:
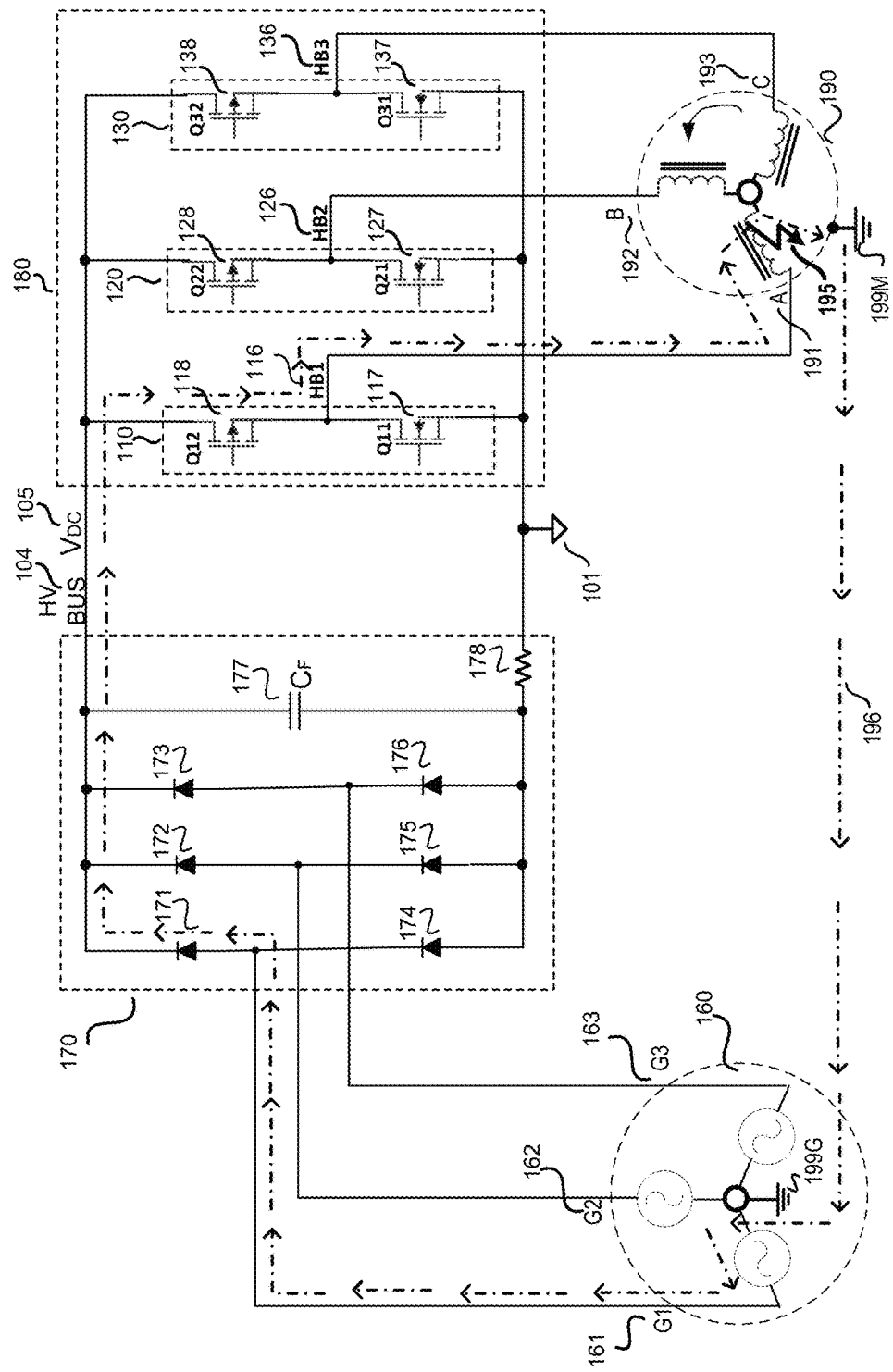
FIG. 1B shows an example fault of a motor winding to chassis short that may cause a short circuit current through the high-side switch, which results in a high-side control to low-side control communication for protection in accordance with the teachings of the present invention.

FIG. 1B shows an example short circuit fault between a motor winding and chassis, which may cause a short circuit current through the high-side switch that is detected by the high-side control block or driver. Such a fault requires high-side to low-side control block or driver communication (i.e., a fault report) to be transmitted from the LS control Fault terminal through the "Fault Communication Bus" to the system μC for proper protection processing.

In FIG. 1B, three phases G1 161, G2 162, and G3 163 of the generator 160 generate dc voltage $V_{DC}$ 105 on high voltage HV bus 104 through a 3-phase rectifier module 170 across filter components, capacitance $C_F$ 177 and resistor 178. The 3-phase rectifier module 170 includes six rectifier diodes 171, 172, 173, 174, 175 and 176. The dc voltage $V_{DC}$ 105 across a three-phase inverter 180 in reference to ground 101 generates a three-phase ac voltage with regulated amplitude and controlled frequency on three-phase terminals A 191, B 192, and C 193 of the three-phase motor drive 190 (e.g., BLDC motor) for a desired function with controlled speed and torque. The three-phase inverter 180 as explained in FIG. 1A includes switcher modules 110, 120, and 130 with each including high-side HS and low-side LS switches and half-bridge mid points, with similar reference numbers as described in FIG. 1A, applying the three-phase inverted voltage across motor drive 190.

If a spark or a short circuit fault occurs, which is a common fault event and is illustrated in FIG. 1B with the symbolic spark bold line 195 from one phase winding A 191 to the grounded chassis occurs in the motor drive 190, the path of the short circuit fault current is shown with the thick dash-dot line. The chassis of motor drives are usually coupled to a safety ground (e.g., to a buried metallic pipeline or a ground-well). In FIG. 1B, based on the chassis shorted winding (e.g., A 191) and based on the conducting generator phase (e.g., G1 161), the fault current path is shown from faulty motor winding 191, through the grounded chassis 199M, across a ground path 196 to common ground 199G of the generator 160, to conducting generator phase G1 161, and to the rectifier diode 171. The fault current then passes through high-side switch Q12 118 and half-bridge mid-point HB1 116 of the switcher module 110, and eventually the fault current closes back in the faulty winding phase A 191 of the motor drive 190.

As can be observed in such the fault cases, the fault current may only be transferred and closed through any of the high-side switches, not visible to low-side control and to μC for appropriate protection, which may result in fatal damage and a safety hazard. Such high-side over current faults in known solutions can typically only be detected by complicated circuitry, or by external current sense resistors, which consequently result in extra costs and space required on the circuit board.

In examples in accordance with the teachings of the present invention, a high-side to low-side control communication for fault and status updates provide a cost effective method and implementation for reliable operation/functioning of the half-bridge inverter modules in motor drive industry. Examples in accordance with the teachings of the present invention save on the cost and size of the design board, which in other alternate known solutions require multiple external components to detect and protect against faults in the HS switch and control block.

Figure 2:
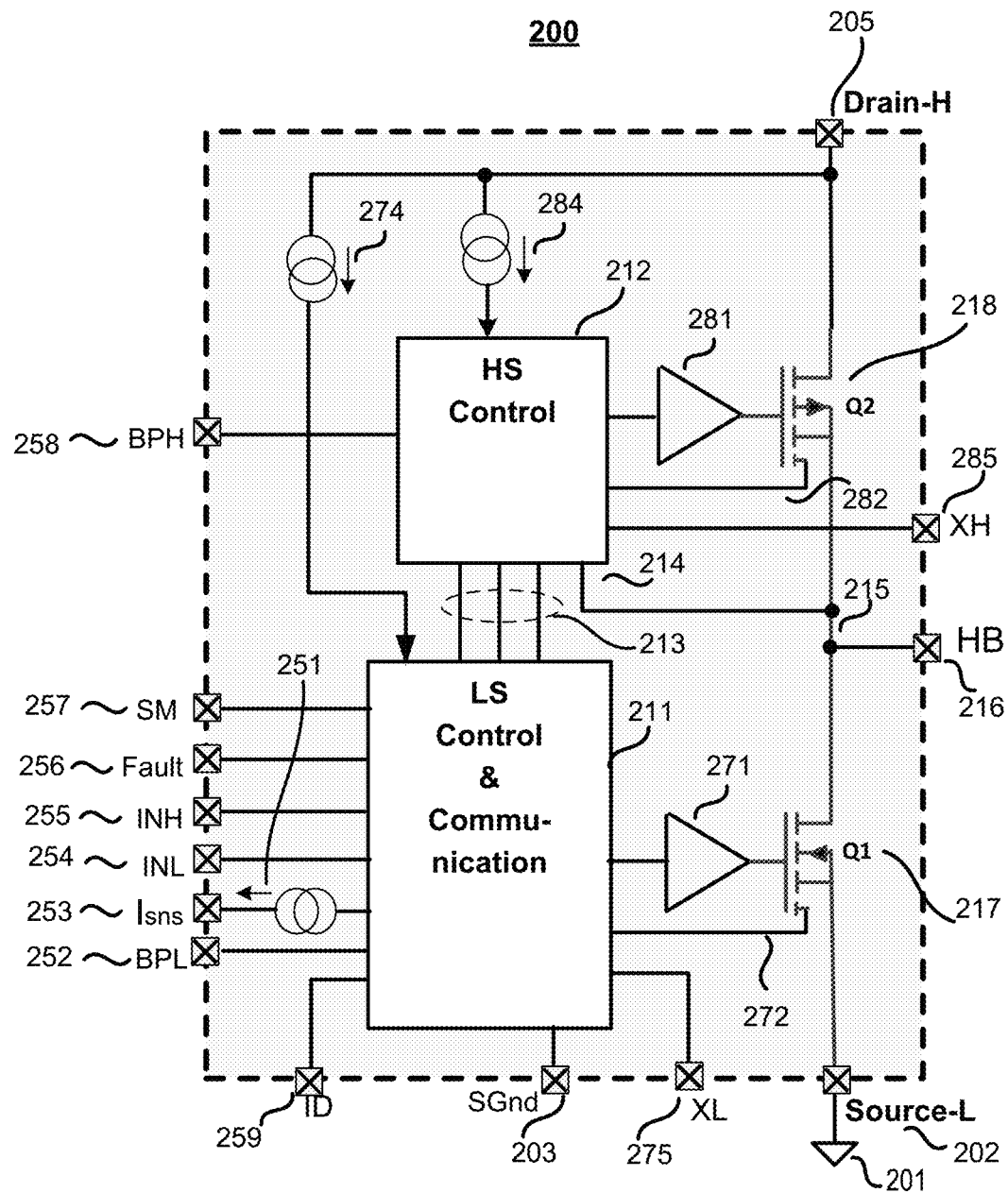
FIG. 2 shows an example illustrating increased detail of the switching devices and control blocks inside a half-bridge inverter module and related signals including high-side to low-side communication in accordance with the teachings of the present invention.

FIG. 2 is a diagram illustrating a more detailed example of a half-bridge inverter module, switching, and control blocks and their related signals in accordance with the teachings of the present invention. In simplified versions of FIGS. 1A and 1B, the details of half-bridge inverter modules were not shown to avoid obscuring the teachings of the present invention. It is appreciated that the half-bridge inverter modules in FIGS. 1A and 1B may have a detailed structure similar to FIG. 2 as described below based on teachings of the present invention.

As depicted in the example of FIG. 2, half-bridge inverter module 200 includes low-side MOSFET switch Q1 217 and high-side MOSFET switch Q2 218, which are coupled in series. High-side Drain-H 205 may be coupled to the HV bus (e.g., HV bus 104 in FIGS. 1A and 1B). The low-side Source-L 202 is coupled to system ground 201. The half-bridge mid-point 216 may be coupled to one phase terminal of the motor drive (e.g., either A 191, B 192, or C 193 of motor 190 in FIG. 1A or 1B). In one example, switch Q1 217 and switch Q2 218 may include current sensing through sense FET terminals 272 and 282, respectively.

MOSFET switch Q1 217 is coupled to gate driver 271 and receives gating signals from low-side LS control and communication block 211. MOSFET switch Q2 218 is coupled to gate driver 282 and receives gating signals from high-side HS control block 212. The synchronized turn-on (i.e., gating) signals for low-side switch 217 and high-side switch 218 provide non-overlapped switching, which prevent a shoot-through with appropriate dead time between turn-on pulses. The logic level gating signals are generated inside the system controller μC 150 (see, e.g., FIG. 1A) in response to the sensed signals in LS control 211 and HS control 212, which are communicated or transferred through communication links 213 between control blocks. In one example, low side logic level gating signal INL 254 and high side logic level gating signal INH 255 may be calculated in system controller 150 of FIG. 1A in response to the received sensed current Isns 253 from LS control and communication block 211. The low-side logic level gating signal INL 254, which controls low-side LS switch Q1 217, is processed in LS control and communication block 211. The high side logic level gating signal INH 255 for controlling the high-side HS switch Q2, 218 is communicated through communication links 213 to the HS control 212 to generate gating signal for the high-side HS switch Q2, 218.

In one example, the maximum current (i.e., current limit) of the low-side switch Q1 217 and high-side switch Q2 218 may be defined by external resistors, which may be coupled to terminals XL 275 and XH 285, respectively. It is appreciated that the measurements and signals for the low-side switch and controller are referenced to system ground 201. However, all the measurements and signals for the high-side HS switch and control block 212 are referenced through internal pad 214 to the half-bridge mid-point 215, which is coupled to terminal HB 216.

In one example the LS and HS control blocks could be self-supplied, such as for example during startup, through current supplies 274 and 284, which in one example are through the high-side drain coupled to Drain-H 205 (e.g., from a tap terminal). During normal operation, the internal supplies of the LS control (and communication) block 211 and HS control block 212 are provided through terminals BPL 252 and BPH 258 respectively. The high-side supply terminal BPH 258 should be referenced to the source of HS switch Q2 218, which is coupled to half-bridge point HB 216. Whenever the LS switch Q1 217 turns on, the mid-point HB 216 is pulled down to the system ground 201. When LS switch Q1 217 turns off, the mid-point HB 216 will float, which as a common practice is coupled to the mid-point HB 216 through a boot-strap capacitor (not shown).

In the depicted example, each half-bridge module is identified and differentiated by a defined signal at its identification ID terminal 259, that is configured to be in a unique predefined state to uniquely identify the respective half-bridge module. For instance, in one example, there are three half-bridge modules. The ID terminal of each half-bridge module may therefore be a three-state terminal, and the ID terminal may be in one of the three states uniquely coupled to a predefined one of a "low" logic state (e.g., coupled to system ground 201), or coupled to the low-side supply terminal (e.g., coupled to logic "high" at BPL 252), or may be left floating (e.g., in a "high impedance" open circuit state). As such, in various examples, enable signals transferred from each half-bridge module can therefore be differentiated to uniquely identify the respective half-bridge module, and allow the system controller μC to respond. For instance, in FIG. 2 the identification terminal ID 259 of the module half-bridge 200 is coupled to low-side supply terminal BPL 252, which in one example may be capacitively coupled to the system ground 201. The low-side source, terminal Source-L 202 and signal ground terminal SGnd 203 of the half-bridge module 200 would also be coupled to the system ground 201.

The system monitor terminal SM 257 of the half-bridge module 200 may be coupled through a resistor to the HV bus (e.g., HV bus 104 in FIGS. 1A and 1B). The half-bridge mid-point terminal HB 216 may be coupled to one of the phase terminals of a multiphase motor (e.g., A 191, B 192, or C 193 of motor drive 190 in FIGS. 1A and 1B). The motor drive in one example may be a brushless 3-phase motor included in for example an electric appliance, power tool, or the like. In the half-bridge module 200, the BPH 258 terminal may be coupled as a supply terminal to the high-side HS control block 212, and BPL 252 terminal may be coupled as a supply terminal to the low-side LS control 211.

The instantaneous sensed currents of the low-side LS and high-side HS switches (e.g., as sensed through the sense FET) are processed in the low-side LS control and communication block 211 to provide the sensed current signal illustrated as current supply 251 on a single-pin/terminal Isns 253. The current signal across a resistor may generate a voltage signal for process in system controller 150 of FIG. 1A. In one example, any over current fault in the HS switch is reported to the LS control and communication block 211 through communication links 213 only during the next switching cycle that LS switch is turned on. Thus, high-side and low-side instantaneous sensed currents or over current faults cannot be reported simultaneously, and therefore only a single pin or terminal Isns1 253 is needed in order to report both current events in the HS and LS switches to the µC in accordance with the teachings of the present invention.

Figure 3:
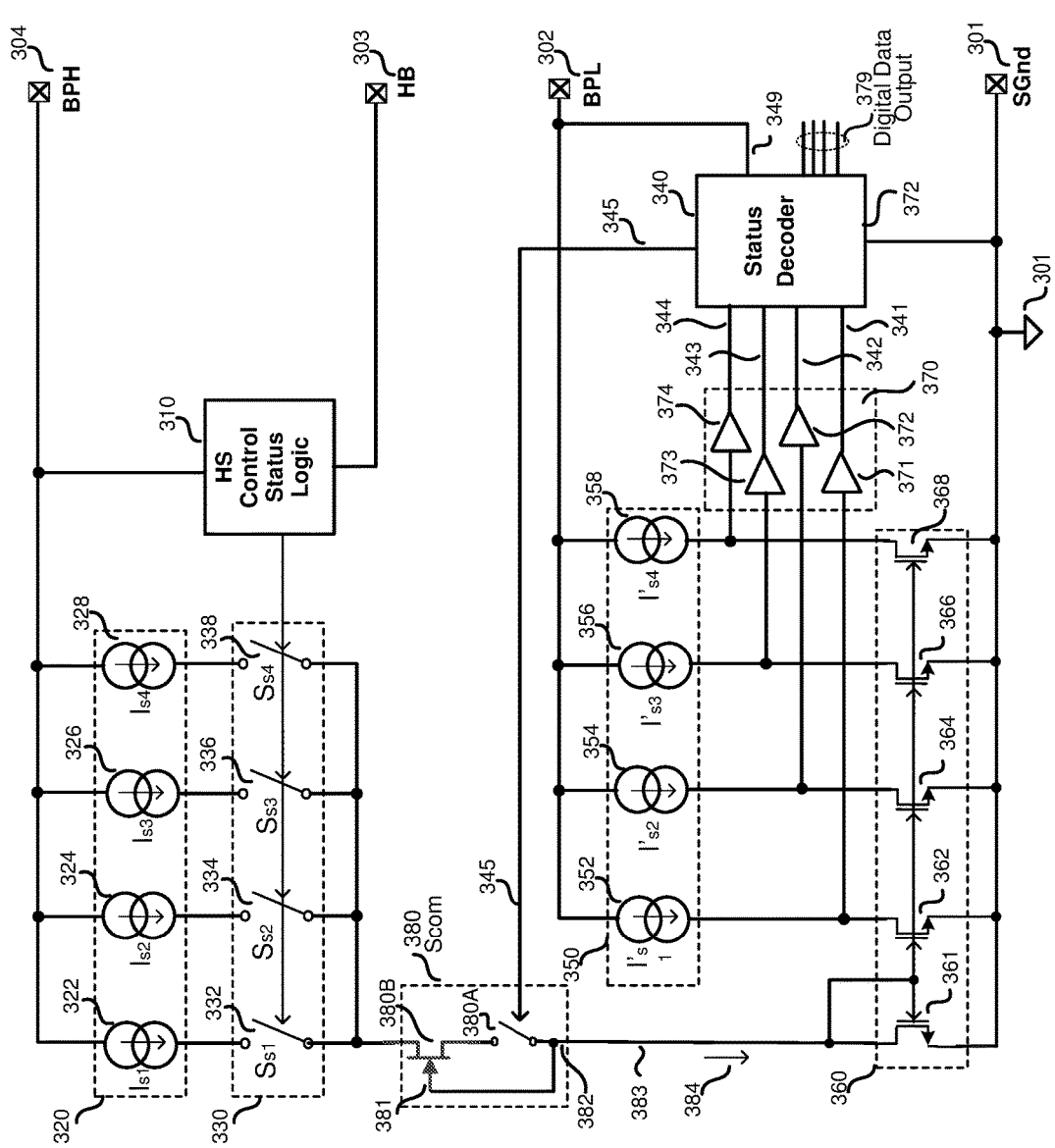
FIG. 3 shows example circuitry for the coding and decoding of a high-side control to low-side control status report in accordance with the teachings of the present invention.

In case the high-side driver detects a fault, it communicates the type of fault to the low-side driver, which in turn allows the low-side driver to flag the fault to the system controller through the Fault output terminal 256 and the single-wire Fault Bus 140 (see, e.g., FIG. 1A). Communication from the floating high-side control 212 to the ground referenced low-side control 211 uses a single current pulse with varying amplitude, which in one example may be used to encode and represent different faults. The priority list of the communicated faults is presented below in Table 1, and one example implementation of the encoding/decoding circuit blocks for fault communication from HS control to LS control is illustrated in FIG. 3. In one example, the communication is encoded by varying the amplitude of a current pulse to minimize the required time for the LS driver to decode (decipher) the transmitted information.

In one example, the control signals to and from each half-bridge module are coupled to the system controller, µC 150 (see, e.g., FIG. 1A; in other examples different control blocks other than a microcontroller may be utilized). In one example, the fault signals that are sensed by either low-side control block 211 or by high-side control block 212 and then communicated through communication link 213 to the low-side control block 211, would be coupled through Fault terminal 256 of the half-bridge module 200 to a single-wire fault communication bus, which is also coupled to the system controller, µC 150 (see, e.g., FIG. 1A).

In one example, the Fault terminal 256 may communicate any one of: an over voltage fault warning, a multi-level under voltage fault warning, a device or system level high temperature fault warning, and/or shutdown and over current fault warning in either the high-side or low-side switch. In the example, the fault warnings are coupled to be reported to the system controller µC 150 over a single-wire fault bus (not shown) by encoding through a multi-bit fault word, which may result in either control parameter change in the system controller (or any other control block used), latching, or shutdown. In addition, the system controller may also mutually communicate status request updates or send unlatch commands through the fault bus and control signals.

Steady state operation requires communication from the low side to the high-side driver for turning the HS MOSFET on and off. The LS driver sends one pulse each switching cycle to the HS driver for turning the HS MOSFET on or off. In the event that the high-side driver detects a fault, it communicates the type of fault to the low-side driver. This allows the low-side driver to flag the fault to the system controller µC through the Fault terminal coupled to the Fault Bus. As shown in the example depicted in FIG. 2, there are three links 213 between high-side control block 212 and low-side control and communication block 211. In one example, the first link serves to transfer the turn-on pulse to high-side driver to command HS MOSFET turn-on, the second link is for transferring the turn-off pulse to the high-side driver to turn the HS MOSFET off, and the third link is dedicated to serve as a single wire communication link between high-side and low-side control blocks to report high-side detected faults or the status update in each switching cycle.

Table 1 below lists the type of communicated information and some examples of the high-side detected faults in order of their priority to be communicated from high-side control block 212 to low-side control block 211. The sorted priority order in the first column is based on the risk for system function. The fault or information communicated is listed in second column. The example of the attributed current pulse amplitude for each fault coding is shown in the third column. The fourth column defines location and information of the fault. It is appreciated that the error or fault of the supply voltage being out of the target range should have the highest priority as any communication from high-side HS control block to low-side LS control block is stopped or prevented.

TABLE 1

High-side to low-side communication for the high-side detected faults or acknowledgement

| Priority | Fault/Information | $I_{com}$ | Note |
| --- | --- | --- | --- |
| 1 | System Error | 0 µA | Supply voltage out of target range; XH pin short/open circuit fault |
| 2 | Over Current [$V_{x(th)}$] | 200 µA | At High-Side MOSFET |
| 3 | Over Temperature [$T_{SD}$] | 100 µA | At Low-Side MOSFET |
| 4 | High Temperature Warning [$T_{WA}$] | 50 µA | At Low-Side MOSFET |
| 5 | Acknowledge Signal | 25 µA | No fault detected/successful power up |

As mentioned above, the faults and information communicated from the HS control block 212 are listed in Table 1 in order of their priority or risk. In case the HS control block 212 detects two faults at the same time, it communicates the fault with the higher priority to the LS control block 211 the next time the LS MOSFET 217 turns on.

In one example, the communication process uses a single current pulse, the amplitude of which encodes the type of fault. In one example, a plurality current sources may be utilized to provide such a current pulse with the amplitude to encode the type of fault, as will be shown below with a plurality of current sources block 320 in FIG. 3. This single current pulse minimizes the communication time $t_{COM}$, which in one example is a maximum of 250 ns, required by the LS control block 211 to decipher or decode the transmitted information.

The acknowledge pulse indicates that no fault has been detected. When the high-side supply voltage $V_{BPH}$ (e.g., at terminal BPH 258 in FIG. 2) and the internal supply rail (e.g., a 5 V rail) are within the target range and no open/short-circuit fault is present on the XH-terminal 285, an acknowledge pulse (e.g., a 25 µA current pulse) is sent by the HS control block 212 to the LS control block 211 every time the LS MOSFET 217 is turned on. This enables the LS control block 211 to verify that HS-to-LS communication is working properly. The acknowledge pulse is also sent by the HS control block 212 after a successful power-up sequence.

Figure 4:
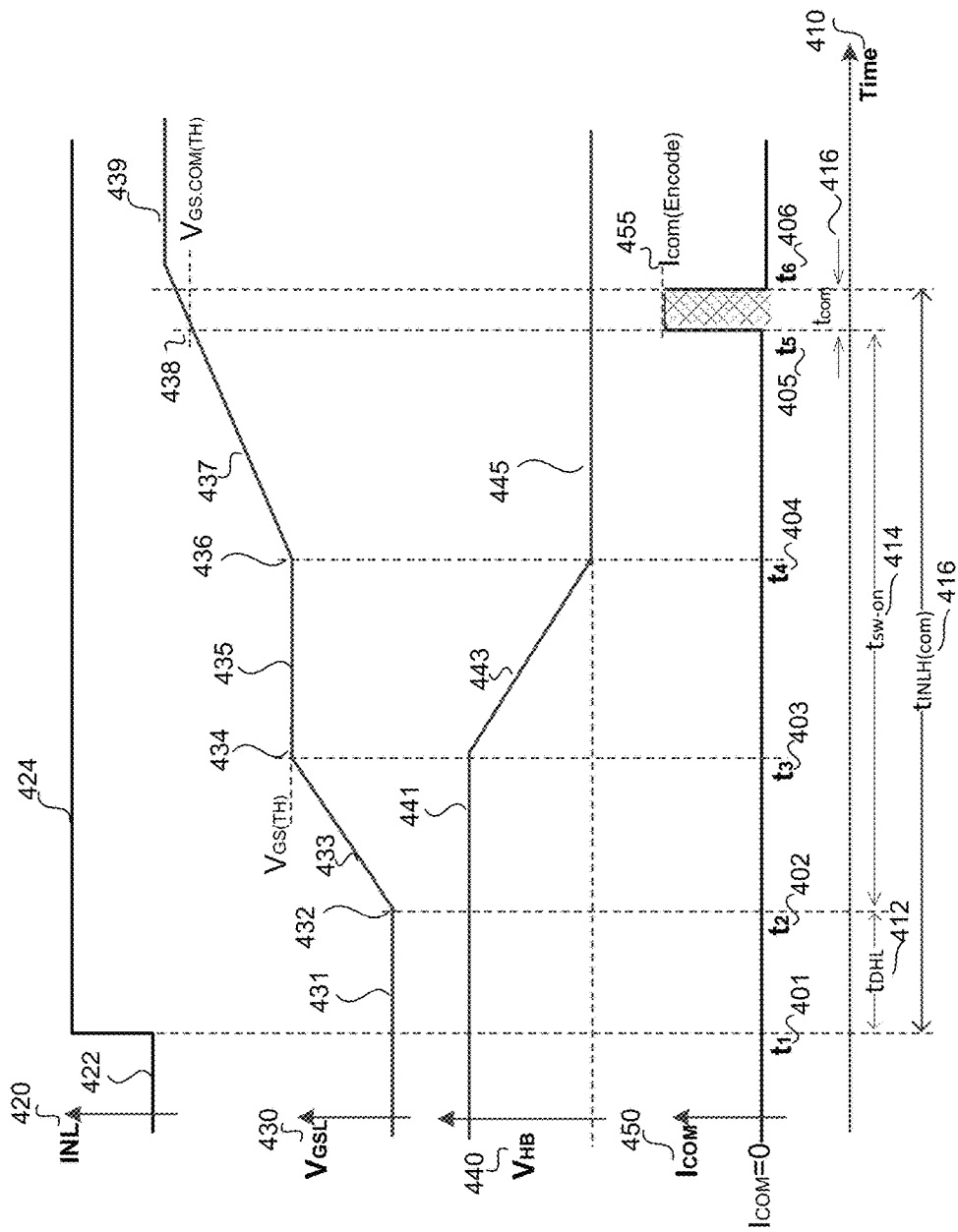
FIG. 4 is a timing diagram of one example of a high-side to low-side communication current pulse signal illustrating an example of timing intervals in accordance with the teachings of the present invention.

If the LS control block 211 does not receive an acknowledge signal or pulse after the LS MOSFET 217 has turned on, and the low-side MOSFET gate voltage $V_{GSL}$ has reached a defined gate threshold $V_{GSCOM(TH)}$ (see, e.g., $V_{GSCOM(TH)}$ 438 in FIG. 4), it continues to wait for the acknowledge signal pulse until either it receives the pulse, or until the falling edge of the low-side gating signal INL (see, e.g., INL 420 in FIG. 4 from terminal INL 254 of FIG. 2) for LS MOSFET 217 from the system controller µC 150 occurs and the LS MOSFET 217 turns off again. If the falling edge of the low-side gating signal INL 420 occurs without having received a communication pulse, the device reports a HS control block or driver fault to the system through the "FAULT" output terminal. The device reports HS-to-LS communication faults in the form of a HS control block or driver fault only once when the fault occurs. Once the fault clears, it transmits a status update through the fault terminal indicating that the HS control fault has been cleared.

Communication occurs every time the LS MOSFET channel is turned on, which may be indicated with the low-side gating signal INL being high, after the HB-point, which is the LS MOSFET drain, has been pulled low to the low-side MOSFET source potential level, which is coupled to the Source-L terminal. To guarantee a fully turned on LS MOSFET, the LS control block monitors the Gate-to-Source voltage $V_{GS}$ and initiates the HS-to-LS communication once it has reached the threshold.

FIG. 3 shows one example implementation of individual current sources for encoding and decoding of high-side detected faults or acknowledgement/update of the status in accordance with the teachings of the present invention. It is appreciated that this example is not limiting and other possible implementations in accordance with the teachings of the present invention may also be utilized by combining a different number of switching current or voltage sources to encode or decode the detected faults through the high-side control. For instance, in another example, even two switching current sources may be sufficient for encoding up to 4 fault events ($2^N$ events, with N=2), or a combination of three switching current sources may differentiate up to 8 different fault events ($2^N$ events, with N=3). However, in depicted example of FIG. 3 each individual current source with the series switch represents one of the four detectable faults in the high-side HS control block 212.

As shown in the example depicted in FIG. 3, the first plurality current source block 320 includes individual current sources $I_{S1}$ 322, which in one example is equal to 200 µA, $I_{S2}$ 324, which in one example is equal to 100 µA, $I_{S3}$ 326, which in one example is equal to 50 µA, and $I_{S4}$ 328, which in one example is equal to 25 µA. In the example, current sources $I_{S1}$ 322, $I_{S2}$ 324, $I_{S3}$ 326, and $I_{S4}$ 328 are coupled to and supplied from the high-side supply terminal BPH 304. The plurality switch block 330 includes switching devices $S_{S1}$ 332, $S_{S2}$ 334, $S_{S3}$ 336 and $S_{S4}$ 338, which are controlled through the high-side HS Control Status Logic block 310 and are respectively coupled in series with current sources $I_{S1}$ 322, $I_{S2}$ 324, $I_{S3}$ 326 and $I_{S4}$ 328. The high-side HS Control Status Logic block 310 receives supply voltage from the high-side supply terminal BPH 304 in reference to the half-bridge node at terminal HB 303.

Communication is encoded by varying or adjusting the amplitude of the single value current pulse through one of the individual current sources either $I_{S1}$ 322, $I_{S2}$ 324, $I_{S3}$ 326 or $I_{S4}$ 328 in order to minimize the time required for the LS control block 211 to decipher/decode the transmitted information, which as will be shown below in FIG. 4 with time interval $t_{com}$, which in one example has a maximum of 250 ns.

The encoded high-side fault or update information is transferred by an adjusted amplitude current pulse 384, which in one example may be varied by the fault type, through a communication switch module $S_{com}$ 380 and a single-wire link 383 to the low-side control block. It is appreciated that the communication switch module $S_{com}$ 380 includes of a high voltage HV JFET switch 380B coupled in series with a low-voltage LV switch 380A (e.g., a MOSFET switch). Control terminal 381 of JFET switch 380B is coupled to low potential terminal 382 of LV switch 380A (e.g., a source terminal of a LV MOSFET). Thus, during the conduction period or on-time of LV switch 380A, the JFET switch 380B remains in an on-state, and when LV switch 380A goes to off-state, the HV JFET switch 380B turns off and buffers or drops the substantial portion of the high bus voltage to mitigate the off-voltage on the LV switch 380A.

The Status Decoder block 340 receives a supply voltage from low-side supply terminal BPL 302 in reference to system ground 301, and in each switching cycle through the control signal 345 commands the turn-on of the communication switch $S_{com}$ 380 to retrieve the encoded signal of the HS fault or status update. The encoded information is transferred to the Status Decoder block 340 through a plurality current source block 350 and a second plurality switch block 360.

The single communication switch $S_{com}$ 380 on a single-wire communication link 383 couples the encoded current pulse to the second plurality switch block 360 for current mirroring, which includes diode connected NMOS 361 and NMOS switches 362, 364, 366 and 368 in series with the second plurality current source block 350, which includes the same sequence of individual current sources $I'_{S1}$ 352, which in one example is equal to 200 µA, $I'_{S2}$ 354, which in one example is equal to 100 µA, $I'_{S3}$ 356, which in one example is equal to 50 µA, and $I'_{S4}$ 358, which in one example is equal to 25 µA, which are supplied through the low-side supply terminal BPL 302. The NMOS switches 362, 364, 366, and 368 in the second plurality switch block 360 are gated through the same gating signal as the diode connected NMOS 361, and have the same channel sizes of NMOS transistors 361, 362, 364, 366, and 368 to mirror the current 384 transferred through link 383 and communication switch $S_{com}$ 380 from the activated switch in the first plurality switch block 330 and the series conducting current source in the plurality current source block 320.

Those current sources in plurality current source block 350, which are of a lower value than the mirrored current, are pulled up to the supply voltage BPL 302 pulling up the related inputs of the buffers in plurality buffer block 370 (buffer 371, 372, 373 and/or 374) and generating low signals at the related inputs of the Status Decoder block 340 (input 341, 342, 343 and/or 344). On the other hand, the current sources in the plurality current source block 350 that are higher than the mirrored current may conduct to the ground terminal SGnd 301. Thus, the related inputs of the buffers in plurality buffer block 370 (buffer 371, 372, 373, and/or 374) that are pulled low to ground SGnd 301 will generate high signals at the related inputs of the Status Decoder block 340 (input 341, 342, 343, and/or 344). It is appreciated that the combination of logic binary signals from buffers in the plurality buffer block 370 to the corresponding terminals of the Status Decoder block 340 are utilized to decipher/decode the communicated data of the high-side HS fault event. The decoded digital data output 379 in one example would be transferred through the low-side LS control block (e.g., LS Control and Communication block 211 of FIG. 2) and across the Fault terminal (e.g., Fault terminal 256 of FIG. 2) to the system controller to generate appropriate protection.

Referring to the numerical labels of the communicated information in FIG. 2, the status update and detected faults in HS control block 212 that are listed in Table 1 are listed in the order of their priority. In the event that two faults are detected by the HS control 212 at the same time, the fault with the higher priority is communicated to the LS control 211 the next time the LS MOSFET 217 is turned on. The acknowledge pulse in row 5 of Table 1 above indicates that no fault has been detected and therefore indicates proper function or operation of the high-side switching device and the high-side control block. In other words, the phase voltage VaPH and internal supply rail (e.g., 5 V) are within the target range, and no open or short-circuit fault is present on XH terminal 285. The acknowledge pulse is sent by the HS control 212 to the LS control 211 every time the LS MOSFET 217 is turned on. This enables the LS control 211 to verify that the HS-to-LS communication interface is working properly. The acknowledge pulse may also be sent by the HS control 212 after a successful power-up sequence. If no acknowledge pulse is received when the LS MOSFET 217 is turned on, a HS-to-LS communication loss fault is communicated to the system controller μC 150 (as shown FIG. 1A) through the Fault output 256 (as shown in FIG. 2; or terminal 119, 129 or 139 as shown in FIG. 1A). Communication occurs every time the LS MOSFET 217 is turned on (when the terminal INL 254 is high) after the half-bridge mid-point 215, which is coupled to HB terminal 216 and coupled to the LS MOSFET Drain, has been pulled low towards potential of the Source-L terminal 202, which is coupled to system ground 201 (or system ground 301 in FIG. 3). To guarantee a full turn-on of the low-side LS MOSFET 217, as shown in graph of FIG. 4, the low-side LS control 211 monitors the gate-to-source voltage $V_{GS}$ of the LS MOSFET 217 and initiates the HS-to-LS communication once it has reached the threshold value $V_{GS(TH)}$.

FIG. 4 is an example timing diagram illustrating the startup process and the communication current pulse from high-side HS to low-side LS control in accordance with the teachings of the present invention. The upper graph in FIG. 4 shows the logic input gating signal INL 420 for the low-side switch (e.g., Q1 217 in FIG. 2) versus Time 410 on the horizontal axis. At time $t_1$ 401, the low-side switch gating signal INL 420 is transferred from logic low 422 to logic high 424. The gate-source voltage $V_{GSL}$ 430 of the low-side switch (e.g., Q1 217 in FIG. 2) ramps up between time $t_2$ 402 to time $t_3$ 403 (or point 432 to point 434) in response to gating signal INL 420 with some propagation delay $t_{DHL}$ 412, from a low level 431 to a higher level 434 with a slope 433, which depends on the charging rate of the gate-source capacitance of the low-side switch. At time $t_3$ 403 (or point 434) gate-source voltage $V_{GSL}$ 430 has reached to a threshold level ($V_{GS(TH)}$ 435) that the low-side switch drain to source capacitance begins to discharge and the switch gradually turns on.

Graph $V_{HB}$ 440 shows the drain voltage of the low-side switch (point 215 in FIG. 2, coupled to the half-bridge point HB 216). At time $t_3$ 403 (point 434), the gate-source voltage $V_{GSL}$ 430 has reached to the threshold $V_{GS(TH)}$ 435, and the half-bridge terminal voltage $V_{HB}$ 440 drops from high level 441 to low level 445 with a slope 443, while the gate-drain capacitance of the low-side switch, which may also be referred to as the Miller capacitance, is charging, which results in a flat or plateau area 435 on the gate-source voltage graph $V_{GSL}$ 430, which extends to the point 436 at time $t_4$ 404 that drain voltage of low-side switch, which is reflected or presented by half-bridge terminal voltage $V_{HB}$ 440, has dropped to low level 445.

From time $t_4$ 404 that gate-drain capacitance (i.e., the Miller capacitance) is fully charged, the gate-source capacitance continues charging from point 436 with a slope 437 up to time $t_5$ 405 (point 438 on graph $V_{GSL}$ 430) that is the gate-source voltage threshold for communication to start $V_{GS.COM(TH)}$ 438. The gate-source voltage $V_{GSL}$ 430 may further increase to a final value 439. At the gate-source voltage threshold of communication $V_{GS.COM(TH)}$ 438 the HS to LS communication current pulse on graph $I_{COM}$ 450 transfers the encoded information to the LS control block. Referring to FIG. 3, the transfer of encoded information is by current 348 in link 383, which is transferred through the communication switch $S_{COM}$ 380, consisting of a high voltage JFET 380B and a low voltage switch 380A, to the mirroring plurality switch block 360. In FIG. 4, the encoded communication current pulse $I_{com(Encode)}$ 455 has a duration $t_{com}$ 416 from time $t_5$ 405 to time $t_6$ 406. At time $t_5$ 405 that communication switch module $S_{COM}$ 380 is enabled and switch 380A turns on, the current pulse 384 may pass to the low side decoder circuit through the diode connected NMOS transistors 361. At time $t_6$ 406, the comparison result of current pulse will be sampled and decoded through status decoder block 340. The amplitude of the communication current pulse as mentioned in FIG. 3 and in Table 1 presents the encoded information of the HS fault/status, which would be decoded through status decoder 340 described in FIG. 3.

As explained above, for a reliable HS to LS communication, a minimum INL high signal active time $t_{NLH(COM)}$ is required for a reliable HS to LS communication. A fault can be communicated from the HS control block (e.g., HS control block 212 in FIG. 2) and reported through the Fault terminal (e.g., Fault terminal 256 in FIG. 2) to the fault bus and to the system controller (e.g., system controller, μC 150 in FIG. 1A) only if the INL gating signal is high for at least a predefined time $t_{NLH(COM)}$, which in one example is a minimum of 1 μs specified by the propagation delays.

Persons of skill in the art will understand that the disclosed subject matter may be implemented by different versions and varieties. For instance, switching devices may be implemented with any discrete or integrated Si, SiC, GaN or other types of high electron mobility semiconductor switches.

The above description of illustrated example embodiments, including what is described in the Abstract, are not intended to be exhaustive or to be limitation to the precise forms or structures disclosed. While specific embodiments and examples of the subject matter described herein are for illustrative purposes, various equivalent modifications are possible without departing from the broader spirit and scope of the present invention. Indeed, it is appreciated that the specific example currents, voltages, resistances, device sizes, etc., are provided for explanation purposes and that other values may also be employed in other embodiments and examples in accordance with the teachings of the present invention.

What is claimed is:

1. A communication system for use in a switching module, comprising:
    a low-side control block coupled to control switching of a low-side switch of the switching module, wherein the low-side control block is further coupled to be referenced with a low-side reference system ground; and
    a high-side control block coupled to control switching of a high-side switch of the switching module, wherein the high-side control block is further coupled to be referenced with a floating node of the switching module, wherein during steady state operation, the low-side control block is coupled to send signals during each switching cycle to the high-side control block to turn the high-side switch on and off, wherein an encoded status update is communicated from the high-side control block to the low-side control block through a first single-wire communication link coupled between the high-side control block and the low-side control block, wherein the encoded status update is a single current pulse having a variable amplitude coupled to be received by the low-side control block through the first single-wire communication link from the high-side control block, wherein the variable amplitude encodes a plurality different types of faults.

2. The communication system of claim 1, wherein first, second, and third communication links are coupled between the high-side control block and the low-side control block, wherein the first single-wire communication link is the first communication link, wherein the first communication link communicates the encoded status update from the high-side control block to the low-side control block, wherein the second communication link is coupled to provide a turn-on switching signal for the high-side control block, and wherein the third communication link is coupled to provide a turn-off switching signal for the high-side control block.

3. The communication system of claim 1, wherein the high-side control block is coupled to communicate the encoded status update to the low-side control block through the first single-wire communication link during a next switching cycle when the low-side switch has been turned on.

4. The communication system of claim 1, wherein communication of the encoded status update from the high-side control block to the low-side control block through the first single wire communication link occurs within a communication period having a duration that is less than a duration of a switching cycle of the switching module.

5. The communication system of claim 1, wherein the low-side control block referenced with the low-side reference system ground is coupled to decode the variable amplitude of the single current pulse into a decoded digital data output that represents a corresponding one of the plurality of different types of faults, and communicates the decoded digital data output through a fault terminal on the switching module and through a fault bus to a system controller that is also coupled to be referenced with the low-side reference system ground.

6. The communication system of claim 1, wherein a priority of communication of each one of the plurality of different types of faults from the high-side control block to the low-side control block is in order of risk to the switching device and to the communication system.

7. The communication system of claim 6, wherein when the high-side control block concurrently detects a first one of the plurality of different types of faults having a first priority of communication and a second one of the plurality of different types of faults having a second priority of communication, and wherein the first priority of communication is higher than the second priority of communication, the high-side control block is coupled to communicate the first one of plurality of different types of faults having the first priority of communication to the low-side control block a next time the low-side switching device turns on.

8. The communication system of claim 6, wherein a first one of the plurality of different types of faults has a first priority of communication and is a system error fault.

9. The communication system of claim 8, wherein a lack of communication from the high-side control block to the low-side control block indicates that a high-side supply voltage is out of a target range.

10. The communication system of claim 8, wherein the first one of the plurality of different types of faults having the first priority of communication is communicated from the high-side control block to the low-side control block and is encoded by the single current pulse having the variable amplitude of substantially 0 µA.

11. The communication system of claim 6, wherein a second one of the plurality of different types of faults has a second priority of communication and is an over current fault at the high-side switch.

12. The communication system of claim 11, wherein the second one of the plurality of different types of faults having the second priority of communication is communicated from the high-side control block to the low-side control block and is encoded by the single current pulse having the variable amplitude of 200 µA.

13. The communication system of claim 6, wherein a third one of the plurality of different types of faults has a third priority of communication and is an over temperature fault of the low-side switch.

14. The communication system of claim 13, wherein the third one of the plurality of different types of faults that having the third priority of communication is communicated from the high-side control block to the low-side control block and is encoded by the single current pulse having the variable amplitude of 100 µA.

15. The communication system of claim 6, wherein a fourth one of the plurality of different types of faults has a fourth priority of communication and is a high temperature warning fault at the low-side switch.

16. The communication system of claim 15, wherein the fourth one of the plurality of different types of faults having the fourth priority of communication is communicated from the high-side control block to the low-side control block and is encoded by the single current pulse having the variable amplitude of 50 µA.

17. The communication system of claim 6, wherein a fifth one of the plurality of different types of faults has a fifth priority of communication and is an acknowledge signal to update a status of the first single-wire communication link to indicate proper function of the high-side switch and the high-side control block.

18. The communication system of claim 17, wherein the fifth one of the plurality of different types of faults having the fifth priority of communication is communicated from the high-side control block to the low-side control block and is encoded by the single current pulse having the variable amplitude of 25 µA.

19. The communication system of claim 17, wherein the high-side control block is coupled to communicate the acknowledge signal to the low-side control block each switching cycle.

20. The communication system of claim 19, wherein each switching cycle when the low-side switch is turned on when the acknowledge signal is received indicates that no fault has been detected.

21. The communication system of claim 20, wherein no fault being detected indicates that a supply rail is within a target range and no open or short-circuit fault has been detected on high-side coupled terminals.

22. The communication system of claim 17, wherein after a low-side gate voltage of the low-side switch has reached a defined turned on threshold, the low-side control block is coupled to wait for the acknowledge signal from the high-side control block.

23. The communication system of claim 22, wherein the low-side control block is coupled to report a high-side to low-side communication fault to a system controller through a fault terminal in response to a falling edge of a low-side gating voltage of the low-side switch and the acknowledge signal not being received.

24. The communication system of claim 23, wherein the low-side control block is coupled to transmit the acknowledge signal to the system controller through the fault terminal to update a status indicating that high-side control fault has been cleared when the acknowledge signal is received from the high-side control block.

25. The communication system of claim 6, wherein a fifth one of the plurality of different types of faults has a fifth priority of communication and is an acknowledge signal to indicate a successful power-up sequence.

\* \* \* \* \*